(12) United States Patent
Kim et al.

(10) Patent No.: US 6,465,346 B2
(45) Date of Patent: Oct. 15, 2002

(54) CONDUCTING LINE OF SEMICONDUCTOR DEVICE AND MANUFACTURING METHOD THEREOF USING ALUMINUM OXIDE LAYER AS HARD MASK

(75) Inventors: Ji-soo Kim, Yongin; Wan-jae Park; Chang-woong Chu, both of Suwon; Sang-hun Seo, Daejeon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/794,617

(22) Filed: Feb. 28, 2001

(65) Prior Publication Data

US 2002/0113310 A1 Aug. 22, 2002

(30) Foreign Application Priority Data

Oct. 31, 2000  (KR) .............................................. 00-64219

(51) Int. Cl.[7] .............................................. H01L 21/44
(52) U.S. Cl. ....................................... 438/636; 438/706

(58) Field of Search ................................. 438/598, 634, 438/636, 706, 708, 669, 671

(56) References Cited

U.S. PATENT DOCUMENTS 5,506,171 A * 4/1996 Leonard et al. ............. 437/187
6,162,724 A * 12/2000 Hsia et al. .................. 438/669

FOREIGN PATENT DOCUMENTS

KR        10-0257069        2/2000

* cited by examiner

Primary Examiner—Roy Potter
(74) Attorney, Agent, or Firm—Volentine Francos, PLLC

(57) ABSTRACT

A conducting line of a semiconductor device using an aluminum oxide layer as a hard mask, and a method of forming the conducting line. The conducting line, such as a gate line or a bit line of a semiconductor device, includes a conductive layer formed on a semiconductor substrate, a capping insulation layer formed on the conductive layer, and an aluminum oxide layer formed on the capping insulation layer, with the aluminum oxide layer being used as a hard mask.

22 Claims, 5 Drawing Sheets

CONDUCTING LINE OF SEMICONDUCTOR DEVICE AND MANUFACTURING METHOD THEREOF USING ALUMINUM OXIDE LAYER AS HARD MASK

BACKGROUND OF THE INVENTION

1. Field of the Invention

The present invention relates to a semiconductor device and a manufacturing method thereof, and more particularly, to a conducting line of a semiconductor device, and a method of manufacturing the conducting line using an aluminum oxide layer as a hard mask.

2. Description of the Related Art

As the integration density of semiconductor devices increases, the width of wires and the gap between the wires decreases. Accordingly, when a contact hole is formed between parallel spaced wires, the processing margin (e.g., an alignment margin during photolithography), decreases, thereby increasing the likelihood of a defective contact.

In an effort to improve the alignment margin, a self-aligned contact forming method has been utilized. However, even with the self-aligned contact method, as the integration density of semiconductor devices increases and the size of the pattern decreases, the misalignment margin limitations for photolithography are reached.

When forming such a self-aligned contact, a conductive layer, for example, a pad filled with polysilicon, is formed on an active region, and then a contact is formed on the pad. Even when a process of forming such a pad is used, an additional chemical mechanical polishing process for isolation of nodes is required. Due to the chemical mechanical polishing, and an etching process margin for forming a self-aligned contact, it is necessary to form a silicon nitride layer as a hard mask on a gate electrode and on a bit line electrode.

FIGS. 1 through 3 are cross-sectional views illustrating the conventional steps of forming a gate pattern. A gate oxide layer (not shown) is formed on a semiconductor substrate 10 such as a silicon substrate. Next, a conductive layer 12 and a capping insulation layer 14 are sequentially formed on the gate oxide layer, and a photoresist pattern 16 is formed for defining a gate line. The capping insulation layer 14 is formed of silicon nitride. Subsequently, the capping insulation layer 14 is patterned using the photoresist pattern 16 as a mask, and the photoresist pattern 16 is removed. Next, the conductive layer 12 is patterned using the capping insulation layer pattern 14a as a mask, thereby forming gate patterns 15 in parallel which are spaced a predetermined distance from each other on a predetermined region of the gate oxide layer. Each of the gate patterns 15 has a structure in which a conductive layer pattern 12a and a capping insulation layer pattern 14a are sequentially stacked. The conductive layer pattern 12a serves as a gate electrode.

Although not shown, in subsequent process steps, a silicon nitride layer is formed on the entire surface of the resultant structure having the gate patterns 15, and spacers are formed on the sidewalls of the gate patterns 15 by anisotropically etching the silicon nitride layer. An interlayer insulation layer, for example, a high density plasma chemical vapor deposition (CVD) oxide layer, having an excellent characteristic of filling a gap, is formed on the resultant structure. Subsequently, the interlayer insulation layer is planarized using a chemical mechanical polishing process. The planarized interlayer insulation layer is patterned and etched to form a self-aligned contact exposing the semiconductor substrate 10 between the gate patterns 15. A conductive layer is deposited on the entire surface of the resultant structure, and a chemical mechanical polishing process for node isolation is performed, thereby forming a self-aligned contact pad.

Note that with this conventional process, a capping insulation layer (a silicon nitride layer) having a thickness of about 2000 Å or more is necessary. This is because the capping insulation layer (silicon nitride layer) is etched during an etching process for forming the conducting line and the self-aligned contact. Also, one must take into account the "dishing" phenomena which occurs during the chemical mechanical polishing process required for node isolation. However, since the photoresist selectivity decreases as the size of a pattern decreases (e.g., a bar critical dimension), a thick silicon nitride layer (a capping insulation layer) becomes a significant burden when etching a conducting line such as a gate line or a bit line. This is described below in greater detail.

FIG. 4 is a graph illustrating the maximum thickness of a silicon nitride layer (a capping insulation layer) with respect to a bar critical dimension and the thickness of a photoresist pattern. Here, the dotted line indicates the critical thickness of photoresist which does not collapse with respect to bar critical dimensions.

Referring to FIG. 4, as the integration density of semiconductor devices increases, a bar critical dimension ("a" of FIG. 1) decreases. As shown in the graph, the height (thickness) of a photoresist pattern has a limit—the maximum aspect ratio b/a as shown in FIG. 1 of the photoresist pattern is about 3.5—due to the collapse of the photoresist pattern. A decrease in the bar critical dimension decreases the photoresist selectivity during an etching process of a silicon nitride layer (a capping insulation layer), thereby restricting the available maximum thickness of the silicon nitride layer. For example, when a bar critical dimension is 150 nm and the thickness of a photoresist pattern is 3500 Å, the available maximum thickness of a silicon nitride layer is about $3.3 \times 10^3$ Å. However, when a bar critical dimension is 100 nm and the thickness of a photoresist pattern is 3500 Å, the available maximum thickness of a silicon nitride layer is about $2.7 \times 10^3$ Å.

FIG. 5 is a graph illustrating the thickness of a silicon nitride layer (a capping insulation layer) remaining after a conducting line is etched to a maximum thickness of the silicon nitride layer calculated in FIG. 4, that is, before a chemical mechanical polishing is performed. As shown in FIG. 5, the thickness of a remaining silicon nitride layer is limited at a certain bar critical dimension, and particularly, that node isolation margin decreases to zero as the bar critical dimension decreases. Here, the dotted line indicates the critical thickness of photoresist which does not collapse with respect to bar critical dimensions.

As described above, a decrease in the bar critical dimension decreases the photoresist selectivity during an etching process of a silicon nitride layer (a capping insulation layer), thereby restricting the available maximum thickness of the silicon nitride layer. This limits the thickness of the silicon nitride layer remaining after an etching process is performed to form a conducting line and a self-aligned contact. Accordingly, the silicon nitride layer is removed in a chemical mechanical polishing step for node isolation, so that the silicon nitride layer may not fulfill its function as a hard mask. In the worst case, an electrical short of a gate electrode or a bit line electrode may occur.

To overcome these problems, it is necessary to form a relatively thick silicon nitride layer (a capping insulation layer). However, as the bar critical dimension decreases, a photoresist selectivity decreases, so the thickness of the silicon nitride layer is restricted. In addition, the thickness of a photoresist pattern is restricted due to the collapse of the photoresist pattern. Accordingly, a thick silicon nitride layer (a capping insulation layer) is a significant burden in etching the silicon nitride layer.

SUMMARY OF THE INVENTION

To solve the above problems, it is a first object of the present invention to provide a conducting line of a semiconductor device, including an aluminum oxide layer to compensate for the photoresist selectivity decreasing as the bar critical dimension decreases.

It is a second object of the present invention to provide a method of forming a conducting line of a semiconductor device using an aluminum oxide layer as a hard mask, having a large selectivity with respect to a silicon nitride layer, to compensate for the photoresist selectivity decreasing as the bar critical dimension decreases.

Accordingly, to achieve the first object of the invention, there is provided a conducting line such as a gate line or a bit line of a semiconductor device. The conducting line includes a conductive layer formed on a semiconductor substrate, a capping insulation layer formed on the conductive layer, and a hard etching mask layer of aluminum oxide formed on the capping insulation layer.

To achieve the second object of the invention, in one embodiment, there is provided a method of forming a conducting line of a semiconductor device using an aluminum oxide layer as a hard mask. In the method, a conductive layer, a capping insulation layer, an aluminum oxide layer and an anti-reflective coating layer are sequentially formed on a semiconductor substrate. Next, photoresist is deposited on the anti-reflective coating layer, and a photoresist pattern is formed using exposure and development. Thereafter, the anti-reflective coating layer and the aluminum oxide layer are anisotropically dry-etched using the photoresist pattern as a mask, thereby forming an anti-reflective coating layer pattern and an aluminum oxide layer pattern. Next, the photoresist pattern is removed. The capping insulation layer is anisotropically dry-etched using the anti-reflective coating layer pattern and the aluminum oxide layer pattern as a mask, thereby forming a capping insulation layer pattern. Subsequently, the conductive layer is anisotropically dry-etched using the aluminum oxide layer pattern and the capping insulation layer pattern as a mask, thereby forming a conductive layer pattern.

In another embodiment, there is provided a method of forming a conducting line of a semiconductor device using an aluminum oxide layer as a hard mask. In the method, a conductive layer, a capping insulation layer, an aluminum oxide layer and an anti-reflective coating layer are sequentially formed on a semiconductor substrate. Next, photoresist is deposited on the anti-reflective coating layer, and a photoresist pattern is formed using exposure and development. Thereafter, the anti-reflective coating layer and the aluminum oxide layer are anisotropically dry-etched using the photoresist pattern as a mask, thereby forming an anti-reflective coating layer pattern and an aluminum oxide layer pattern. Next, the capping insulation layer is anisotropically dry-etched using the photoresist pattern, the anti-reflective coating layer pattern and the aluminum oxide layer pattern as a mask, thereby forming a capping insulation layer pattern. Then, the photoresist pattern is removed. Subsequently, the conductive layer is anisotropically dry-etched using the anti-reflective coating layer pattern, the aluminum oxide layer pattern and the capping insulation layer pattern as a mask, thereby forming a conductive layer pattern.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Figure 1:
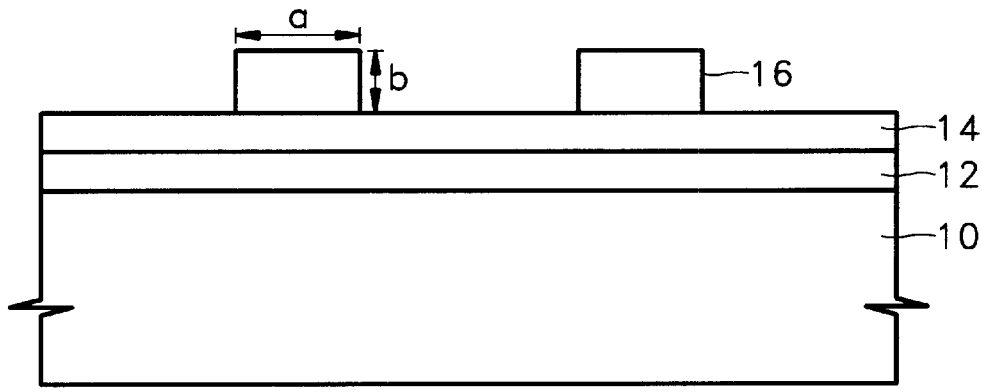
FIGS. 1 through 3 are cross-sectional views illustrating the steps of forming a conventional gate pattern.
Figure 2:
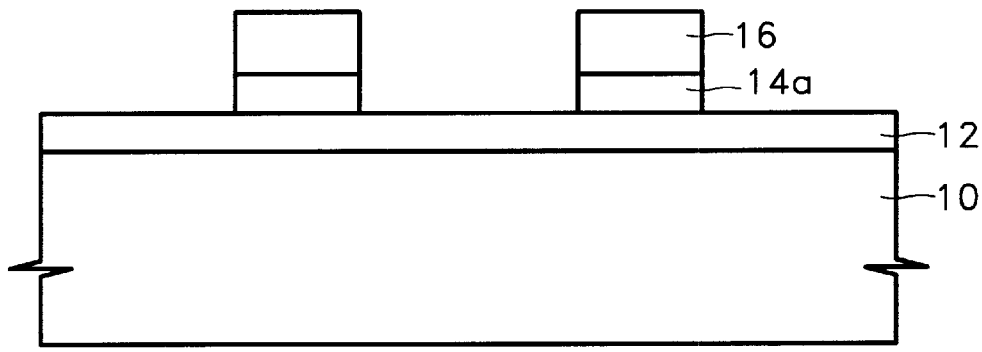
Figure 3:
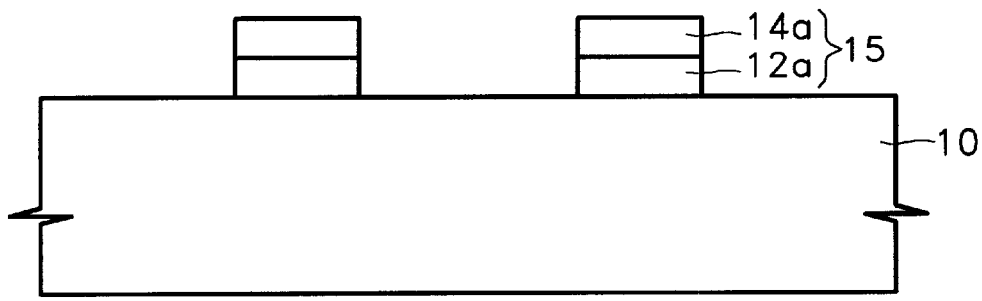
Figure 4:
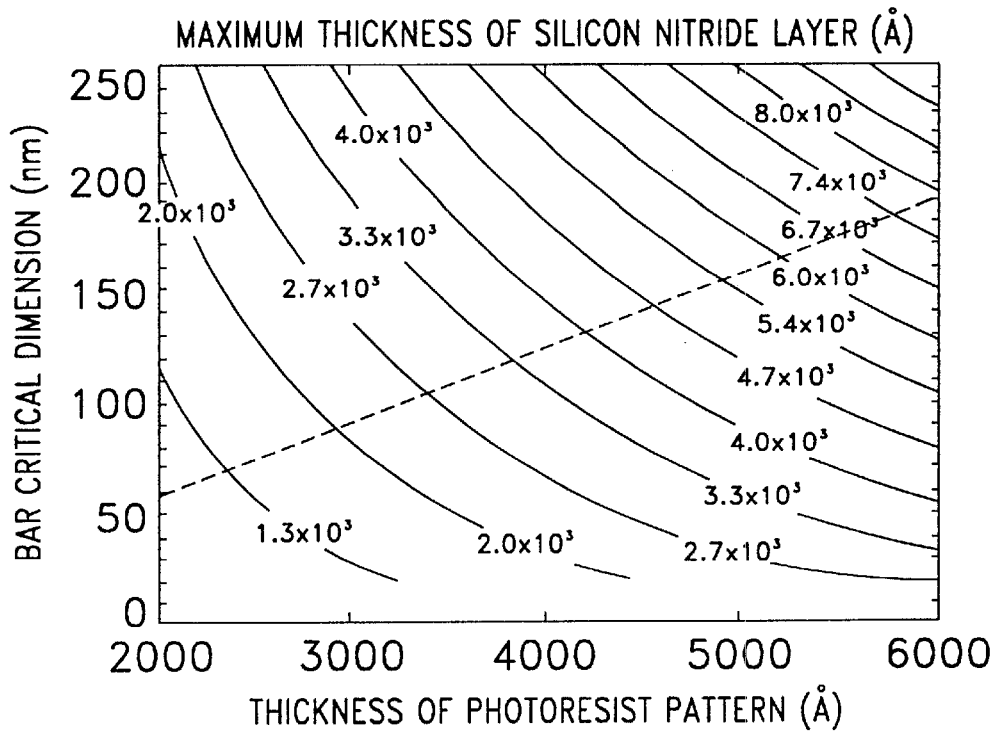
FIG. 4 is a graph illustrating the maximum thickness of a silicon nitride layer (a capping insulation layer) with respect to a bar critical dimension and the thickness of a photoresist pattern.
Figure 5:
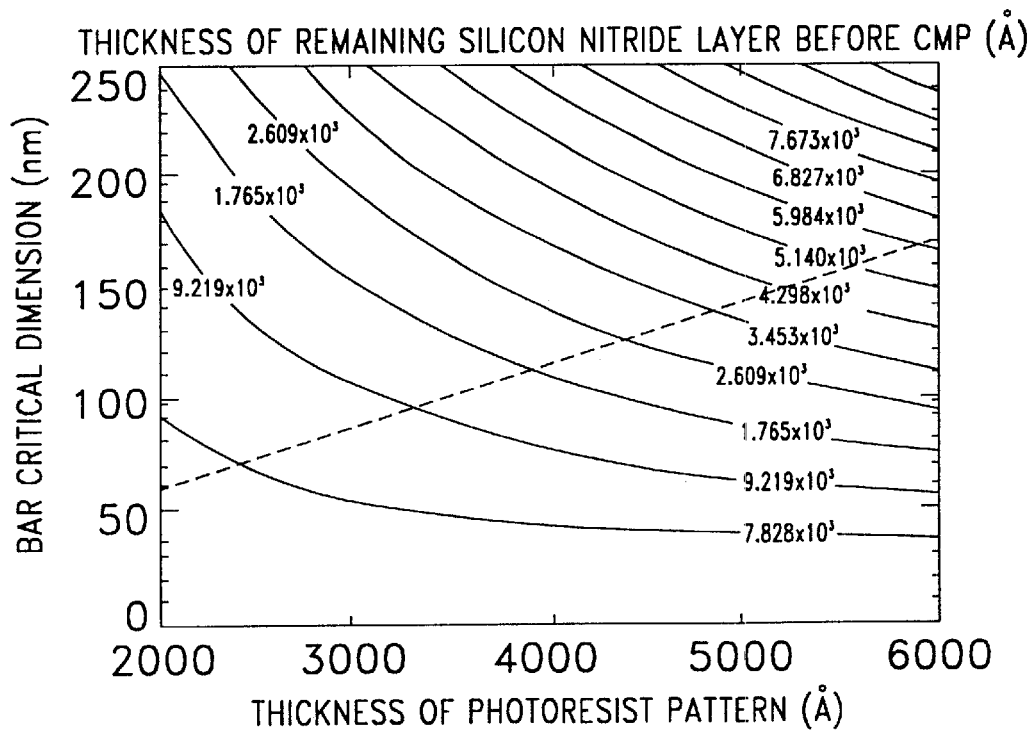
FIG. 5 is a graph illustrating the thickness of a silicon nitride layer (a capping insulation layer) remaining after a conducting line is etched to a maximum thickness of the silicon nitride layer calculated in FIG. 4, that is, before chemical mechanical polishing is performed.

Hereinafter, embodiments of the present invention will be described in detail with reference to the attached drawings. The present invention is not restricted to the following embodiments, and many variations are possible within the sprit and scope of the present invention. In the drawings, the shapes of members are exaggerated for clarity and the same reference numerals denote the same members. Also, when a film is described as being on another film or a semiconductor substrate, it can be directly on the other layer or the semiconductor substrate, or an interlayer film can exist therebetween.

Figure 6:
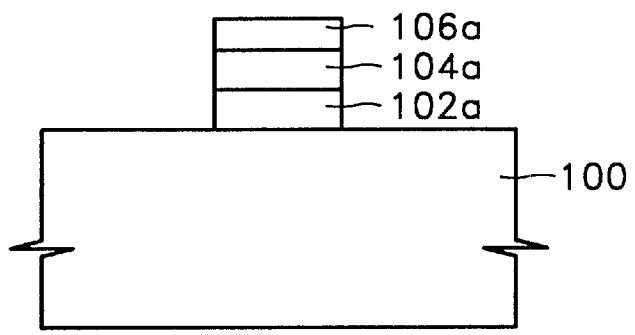
FIG. 6 is a cross-sectional view illustrating a conducting line of a semiconductor device according to an embodiment of the present invention.

Referring to FIG. 6, which illustrates a conducting line of a semiconductor device according to an embodiment of the present invention, the conducting line includes a conductive layer 102a formed on a semiconductor substrate 100, a capping insulation layer 104a formed on the conductive layer 102a, and an aluminum oxide layer ($Al_2O_3$) 106a formed on the capping insulation layer 104a, which aluminum oxide layer 106a is used as a hard mask.

For example, a polysilicon film is formed on the semiconductor substrate 100, and a tungsten film or a tungsten silicide film is stacked on the polysilicon film, to form the conductive layer 102a. A predetermined underlayer, for example, a gate oxide layer, may be formed on the semiconductor substrate 100. The conductive layer 102a is a gate electrode or a bit line electrode. The capping insulation layer 104a is formed on the conductive layer 102a. Preferably, the capping insulation layer 104a is formed of silicon nitride.

The thickness of the capping insulation layer 104a, for example, a silicon nitride layer, is preferably 1000–3000 Å. The aluminum oxide layer 106a used as a hard mask is formed on the capping insulation layer 104a. Preferably, the aluminum oxide layer 106a has a thickness of 200–1000 Å. The aluminum oxide layer 106a has a large etching selectivity with respect to the silicon nitride layer 104a. By using this aluminum oxide layer 106a as a hard mask, the problems occurring in a conventional conducting line of a semiconductor device, using only a silicon nitride layer as a hard mask, can be sufficiently overcome. This will be described later in detail.

Hereinafter, a method of forming a conducting line of a semiconductor device according to preferred embodiments of the present invention will be described.

<First Embodiment>

FIGS. 7 through 11 are cross-sectional views illustrating a method of forming a conducting line of a semiconductor device according to a first embodiment of the present invention.

Figure 7:
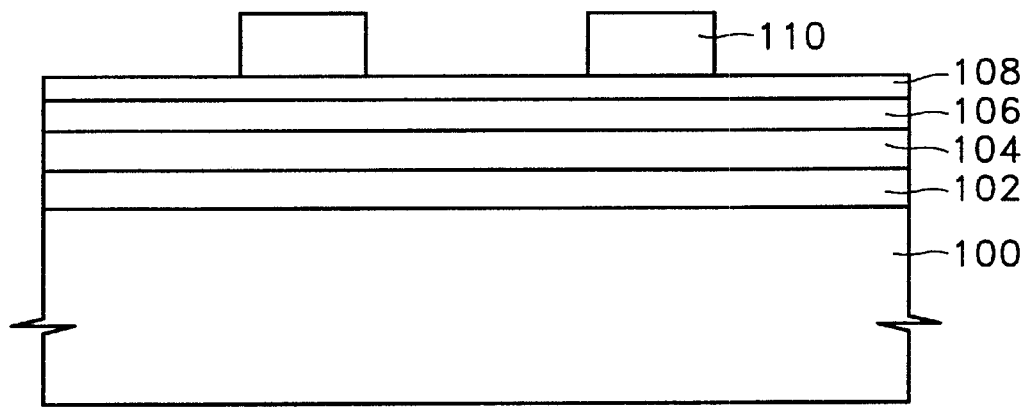
FIGS. 7 through 11 are cross-sectional views illustrating a method of forming a conducting line of a semiconductor device according to a first embodiment of the present invention.

Referring to FIG. 7, a conductive layer 102, a capping insulation layer 104, an aluminum oxide layer 106, and an anti-reflective coating layer 108 are sequentially formed on a semiconductor substrate 100. A predetermined underlayer, for example, a gate oxide layer, may be formed on the semiconductor substrate 100. Preferably, the conductive layer 102 is formed of a polysilicon film and a tungsten film, or a tungsten silicide film stacked on the polysilicon film. The capping insulation layer 104 is preferably formed to have a thickness of 1000–3000 Å. The aluminum oxide layer 106 is preferably formed to have a thickness of 200–1000 Å. The anti-reflective coating layer 108 removes a step difference and prevents irregular reflection of light. More specifically, the anti-reflective coating layer 108 removes a step difference occurring due to stacking layers to some extent, so an anti-reflective coating layer 108 of an appropriate thickness can prevent the distortion of a photoresist pattern due to the irregular reflection of light. The anti-reflective coating layer 108 is preferably formed of a SiON layer, a SiC layer, a SiOC layer or an organic ARC layer. Subsequently, a photoresist layer is deposited on the anti-reflective coating layer 108, and a photoresist pattern 110 is formed using exposure and developing techniques. The photoresist pattern 110 defines a conducting line such as a gate line or a bit line.

Figure 8:
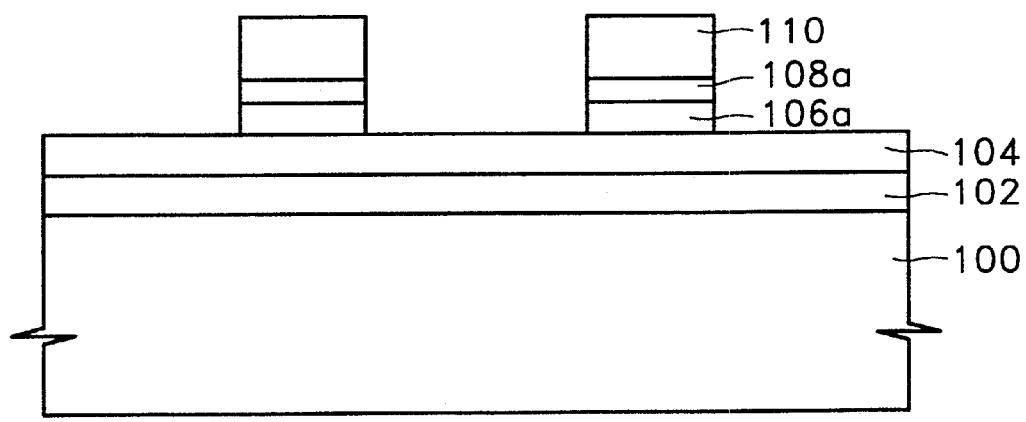

Referring to FIG. 8, the anti-reflective coating layer 108 and the aluminum oxide layer 106 are anisotropically etched using the photoresist pattern 110 as a mask, thereby forming an anti-reflective coating layer pattern 108a and an aluminum oxide layer pattern 106a. Here, it is preferable to perform an etching process using $BCl_3$, $SF_6$, $CF_4$, $CHF_3$, $Cl_2$, HBr, an inert gas or a mixed gas of some of them according to a sputtering method.

The aluminum oxide layer 106 has a very large etching selectivity with respect to the capping insulation layer 104 and is not easily etched compared to a typical material layer, so it is preferable to use a bias power, for example, of 200 eV or more, that is high enough to etch aluminum oxide. A bias power sufficiently lower than used when etching the aluminum oxide layer 106 is employed when etching the capping insulation layer 104 so that the aluminum oxide layer 106 is rarely etched when the capping insulation layer 104 is etched. Accordingly, the etching selectivity of the aluminum oxide layer 106 to the capping insulation layer 104 may increase. This will be described later in detail.

Figure 9:
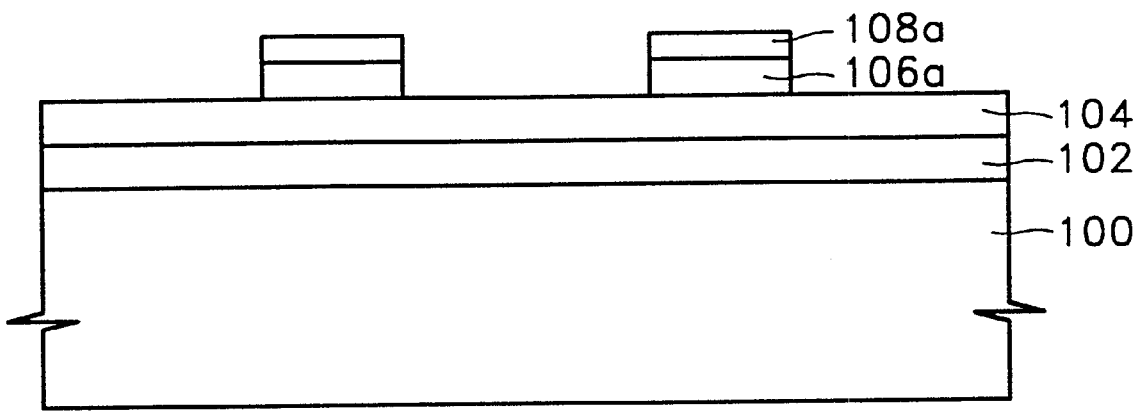

Referring to FIG. 9, the photoresist pattern 110 is removed using a typical process such as an ashing process.

In this embodiment, the photoresist pattern 110 is removed after the anti-reflective coating layer pattern 108a and the aluminum oxide layer pattern 106a are formed and before a capping insulation layer pattern is formed. Alternatively, the photoresist pattern 110 may be removed after the capping insulation layer pattern is formed and before a conductive layer pattern is formed, as will be described later.

Figure 10:
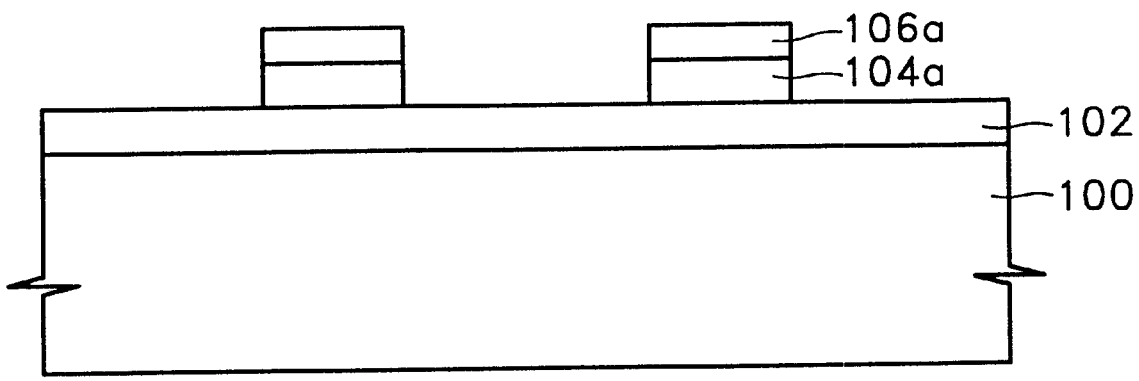

Referring to FIG. 10, the capping insulation layer 104 is anisotropically etched using the anti-reflective coating layer pattern 108a and the aluminum oxide layer pattern 106a as a mask, thereby forming a capping insulation layer pattern 104a. The anti-reflective coating layer pattern 108a, used as a mask while the capping insulation layer 104 is being etched, is almost completely etched and removed while the capping layer 104 is being etched. Here, it is preferable to use a fluorine-based gas such as $CF_4$, $CHF_3$ or $SF_6$, an inert gas such as Ar, or a mixed gas of some of them as an etching gas. Preferably, when etching the capping insulation layer 104, a bias power, for example, of 100 eV or less, is used, which is lower than that used when etching the aluminum oxide layer 106. As described before, when using the lower bias power in this step, the aluminum oxide layer 106 is rarely etched so that the etching selectivity of the aluminum oxide layer 106 can be increased. In this case, the etch rate of the capping insulation layer 104, e.g., a silicon nitride layer, is 4000 Å/min, and the etch rate of the aluminum oxide layer 106 is 16 Å/min. Accordingly, a high selectivity can be obtained by using the aluminum oxide layer 106 as a hard mask. Accordingly, a sufficient thickness of the capping insulation layer 104 can be obtained for chemical mechanical polishing performed for node isolation, even if the bar critical dimension decreases. In a conventional method of forming a conducting line of a semiconductor device using only a silicon nitride layer as a hard mask, the photoresist selectivity decreases as the bar critical dimension decreases, thereby restricting the thickness of a capping insulation layer. However, in the present invention using an aluminum oxide layer as a hard mask, the high selectivity of the aluminum oxide layer to the silicon nitride layer ensures a sufficient thickness of the silicon nitride layer, that is, the capping insulation layer.

Figure 11:
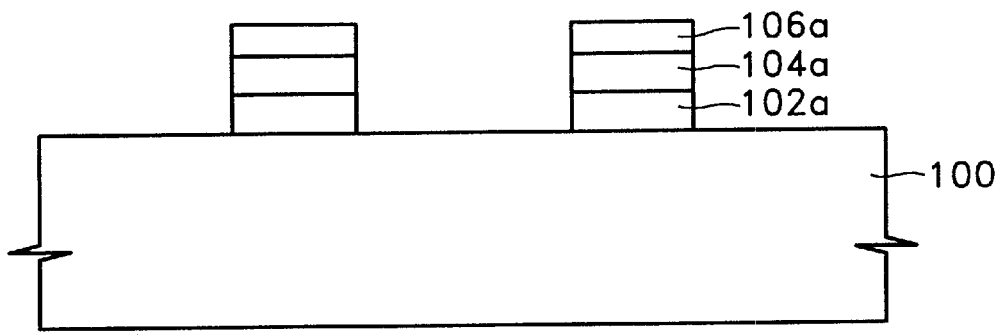

Referring to FIG. 11, the conductive layer 102 is anisotropically dry-etched using the aluminum oxide layer pattern 106a and the capping insulation layer pattern 104a as a mask, thereby forming a conductive layer pattern 102a. As described above, since the anti-reflective coating layer pattern 108a is removed while the capping insulation layer 104 is being etched, only the aluminum oxide layer pattern 106a and the capping insulation layer pattern 104a are used as a mask. The conductive layer pattern 102a will form a gate electrode or a bit line electrode. After forming the conductive layer pattern 102a, the aluminum oxide layer pattern 106a remaining on the capping insulation layer pattern 104a can act as a useful etching stopper for underlying layers, such as the capping insulation layer and the conductive layer, due to its high selectivity to the capping insulation layer during an etching process for forming a self-aligned contact. The aluminum oxide layer pattern 106a remaining on the capping insulation layer pattern 104a may be removed after the conductive layer pattern 102a is formed.

<Second Embodiment>

Figure 12:
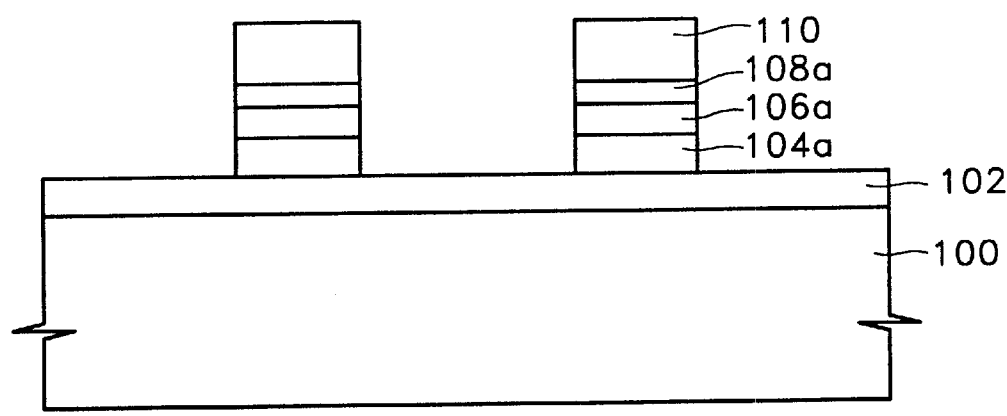
FIGS. 12 and 13 are cross-sectional views illustrating a method of forming a conducting line of a semiconductor device according to a second embodiment of the present invention.
Figure 13:
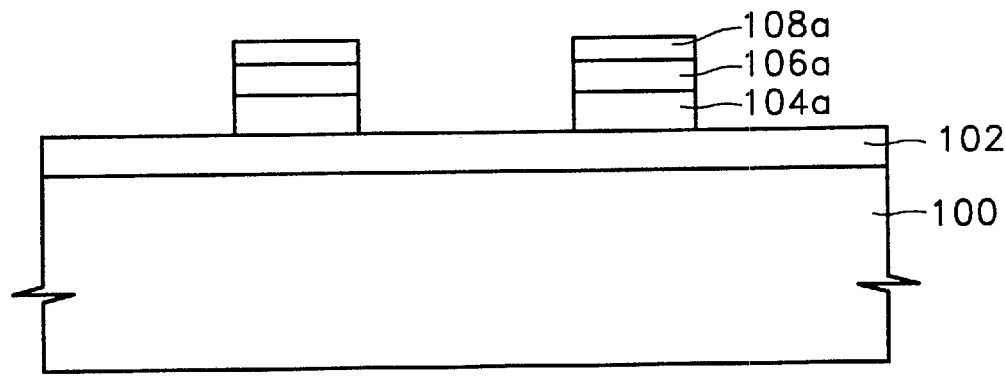

FIGS. 12 and 13 are cross-sectional views illustrating a method of forming a conducting line of a semiconductor device according to a second embodiment of the present invention.

Referring to FIG. 12, the steps of sequentially forming a conductive layer 102, a capping insulation layer 104, an aluminum oxide layer 106 and an anti-reflective coating layer 108 on a semiconductor substrate 100, forming a photoresist pattern 110 on the anti-reflective coating layer 108, and forming an anti-reflective coating layer pattern 108a and an aluminum oxide layer pattern 106 using the photoresist pattern 110 as a mask, are the same as those performed in the first embodiment. Thereafter, the capping insulation layer 104 is anisotropically dry-etched using the photoresist pattern 110, the anti-reflective coating layer pattern 108a and the aluminum oxide layer pattern 106a as a mask, thereby forming a capping insulation layer pattern 104a. Here, it is preferable to use a fluorine-based gas such as $CF_4$, $CHF_3$ or $SF_6$, an inert gas such as Ar or a mixed gas of some of them as an etching gas. Preferably, when etching the capping insulation layer 104, a bias power, for example, of 100 eV or less, is used, which is lower than that used when etching the aluminum oxide layer 106. As described before, when using a lower bias power than used for etching the aluminum oxide layer 106, the aluminum oxide layer 106 is rarely etched so that the etching selectivity of the aluminum oxide layer 106 can be increased. In this case, the etch rate of the capping insulation layer 104, e.g., a silicon nitride layer, is 4000 Å/min, and the etch rate of the aluminum oxide layer 106 is 16 Å/min. Accordingly, a high selectivity can be obtained by using the aluminum oxide layer 106 as a hard mask. Accordingly, a sufficient thickness of the capping insulation layer 104 can be obtained for chemical mechanical polishing performed for node isolation, even if the bar critical dimension decreases. In a conventional method of forming a conducting line of a semiconductor device using only a silicon nitride layer as a hard mask, the photoresist selectivity decreases as the bar critical dimension decreases, thereby restricting the thickness of a capping insulation layer. However, in the present invention using an aluminum oxide layer as a hard mask, the high selectivity of the aluminum oxide layer to the silicon nitride layer ensures the sufficient thickness of the silicon nitride layer, that is, the capping insulation layer.

Referring to FIG. 13, the photoresist pattern 110 is removed using a typical process such as an ashing process. Subsequently, the conductive layer 102 is anisotropically dry-etched using the anti-reflective coating layer pattern 108a, the aluminum oxide layer pattern 106a and the capping insulation layer pattern 104a using a mask, thereby forming a conductive layer pattern 102. The conductive layer pattern 102a forms a gate electrode or a bit line electrode. While the conductive layer 102 is being etched, the anti-reflective coating layer pattern 108a is also etched and almost completely removed. The aluminum oxide layer pattern 106a remaining on the capping insulation layer pattern 104a after the conductive layer pattern 102 is formed has a sufficiently high selectivity to the capping insulation layer so that it can act as a useful etching stopper for underlying layers such as the capping insulation layer and the conductive layer during an etching process for forming a self-aligned contact. The aluminum oxide layer pattern 106a remaining on the capping insulation layer pattern 104a may be removed after the conductive layer pattern 102a is formed.

In a conducting line of a semiconductor device and a method of forming the conducting line according to the present invention, an aluminum oxide layer having a large etching selectivity to a silicon nitride layer, i.e., a capping insulation layer, is used as a hard mask. The aluminum oxide layer effectively acts as a hard mask during an etching process for forming a conducting line and an etching process for forming a self-aligned contact. In other words, the aluminum oxide layer used as a hard mask can compensate for the decrease in photoresist selectivity as the bar critical dimension decreases during the etching process for forming a conducting line, and the aluminum oxide layer can effectively act as an etching stopper during the etching process for forming a self-aligned contact. Also, with the present invention, a hard mask can have a sufficient thickness for chemical mechanical polishing performed for node isolation even if the bar critical dimension decreases, thereby preventing electrical shorts of the conducting line such as a gate line or a bit line.

Although the invention has been described with reference to particular embodiments, the present invention is not restricted thereto. It will be apparent to one of ordinary skill in the art that modifications to the described embodiment may be made without departing from the spirit and scope of the invention.

What is claimed is:

1. A method of forming a conducting line of a semiconductor device, the method comprising the steps of:
    (a) sequentially forming a conductive layer, a capping insulation layer, an aluminum oxide layer and an anti-reflective coating layer on a semiconductor substrate;
    (b) depositing photoresist on the anti-reflective coating layer and forming a photoresist pattern using exposure and development techniques;
    (c) anisotropically dry-etching the anti-reflective coating layer and the aluminum oxide layer using the photoresist pattern as a mask, thereby forming an anti-reflective coating layer pattern and an aluminum oxide layer pattern;
    (d) removing the photoresist pattern;
    (e) anisotropically dry-etching the capping insulation layer using the anti-reflective coating layer pattern and the aluminum oxide layer pattern as a mask, thereby forming a capping insulation layer pattern; and
    (f) anisotropically dry-etching the conductive layer using the aluminum oxide layer pattern and the capping insulation layer pattern as a mask, thereby forming a conductive layer pattern.

2. The method of claim 1, further comprising the step of removing the aluminum oxide layer pattern after the step (f).

3. The method of claim 1, wherein the dry etching of the step (c) is performed by a sputtering method using a gas selected from a group consisting of $BCl_3$, $SF_6$, $CF_4$, $CHF_3$, $Cl_2$, HBr, an inert gas, and a mixed gas of those in the group.

4. The method of claim 1, wherein the dry etching of the step (c) is performed using a bias power sufficient to etch the aluminum oxide layer.

5. The method of claim 1, wherein the dry etching of the step (e) is performed using a gas selected from a group consisting of a fluorine-based gas, an inert gas, and a mixed gas of those in the group.

6. The method of claim 1, wherein the dry etching of the step (e) is performed with a bias power lower than that used in the step (c).

7. The method of claim 1, wherein the anti-reflective coating layer is formed of a material selected from a group consisting of a SiON layer, a SiC layer, a SiOC layer, and an organic ARC layer.

8. The method of claim 1, wherein the capping insulation layer is a silicon nitride layer.

9. The method of claim 8, wherein the silicon nitride layer is formed to have a thickness of 1000–3000 Å.

10. The method of claim 1, wherein the aluminum oxide layer is formed to have a thickness of 200–1000 Å.

11. The method of claim 1, wherein the conductive layer is formed of a polysilicon layer and a tungsten layer, or a tungsten silicide layer stacked on the polysilicon layer.

12. A method of forming a conducting line of a semiconductor device, the method comprising the steps of:

(a) sequentially forming a conductive layer, a capping insulation layer, an aluminum oxide layer, and an anti-reflective coating layer on a semiconductor substrate;

(b) depositing photoresist on the anti-reflective coating layer and forming a photoresist pattern using exposure and development techniques;

(c) anisotropically dry-etching the anti-reflective coating layer and the aluminum oxide layer using the photoresist pattern as a mask, thereby forming an anti-reflective coating layer pattern and an aluminum oxide layer pattern;

(d) anisotropically dry-etching the capping insulation layer using the photoresist pattern, the anti-reflective coating layer pattern and the aluminum oxide layer pattern as a mask, thereby forming a capping insulation layer pattern;

(e) removing the photoresist pattern; and (f) anisotropically dry-etching the conductive layer using the anti-reflective coating layer pattern, the aluminum oxide layer pattern and the capping insulation layer pattern as a mask, thereby forming a conductive layer pattern.

13. The method of claim 12, further comprising the step of removing the aluminum oxide layer pattern after the step (f).

14. The method of claim 12, wherein the dry etching of the step (c) is performed by a sputtering method using a gas selected from a group consisting of $BCl_3$, $SF_6$, $CF_4$, $CHF_3$, $Cl_2$, HBr, an inert gas, and a mixed gas of those in the group.

15. The method of claim 12, wherein the dry etching of the step (c) is performed using a bias power sufficient to etch the aluminum oxide layer.

16. The method of claim 12, wherein the dry etching of the step (d) is performed using a gas selected from a group consisting of a fluorine-based gas, an inert gas, and a mixed gas of those in the group.

17. The method of claim 12, wherein the dry etching of the step (d) is performed with a bias power lower than that used in the step (c).

18. The method of claim 12, wherein the anti-reflective coating layer is formed of a m aterial selected from a group consisting of a SiON layer, a SiC layer, a SiOC layer, and an organic ARC layer.

19. The method of claim 12, wherein the capping insulation layer is a silicon nitride layer.

20. The method of claim 19, wherein the silicon nitride layer is formed to have a thickness of 1000–3000 Å.

21. The method of claim 12, wherein the aluminum oxide layer is formed to have a thickness of 200–1000 Å.

22. The method of claim 12, wherein the conductive layer is formed of a polysilicon layer and a tungsten layer, or a tungsten silicide layer stacked on the polysilicon layer.

* * * * *